(12) United States Patent
Arrigoni

(10) Patent No.: US 10,049,966 B2
(45) Date of Patent: Aug. 14, 2018

(54) SEMICONDUCTOR DEVICE AND CORRESPONDING METHOD

(71) Applicant: STMicroelectronics S.r.l., Agrate Brianza (IT)

(72) Inventor: Alberto Arrigoni, Eupilio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 18 days.

(21) Appl. No.: 15/356,109

(22) Filed: Nov. 18, 2016

(65) Prior Publication Data

US 2017/0309548 A1    Oct. 26, 2017

(30) Foreign Application Priority Data

Apr. 20, 2016   (IT) ........................ 102016000040587

(51) Int. Cl.
| | | |
|---|---|---|
| H01L 23/00 | (2006.01) | |
| H01L 23/495 | (2006.01) | |
| H01L 21/48 | (2006.01) | |
| H01L 23/498 | (2006.01) | |

(52) U.S. Cl.
CPC .... *H01L 23/49506* (2013.01); *H01L 21/4825* (2013.01); *H01L 23/4985* (2013.01); *H01L 23/49524* (2013.01); *H01L 23/49527* (2013.01); *H01L 23/49548* (2013.01); *H01L 23/49805* (2013.01); *H01L 24/16* (2013.01); *H01L 24/81* (2013.01); *H01L 2224/0401* (2013.01); *H01L 2224/131* (2013.01); *H01L 2224/13147* (2013.01); *H01L 2224/14505* (2013.01); *H01L 2224/16225* (2013.01); *H01L 2224/8182* (2013.01); *H01L 2224/81203* (2013.01); *H01L 2224/81207* (2013.01); *H01L 2924/14* (2013.01); *H01L 2924/18161* (2013.01)

(58) Field of Classification Search
None
See application file for complete search history.

(56) References Cited

U.S. PATENT DOCUMENTS

| | | | | |
|---|---|---|---|---|
| 5,328,079 A | * | 7/1994 | Mathew | ................. H01L 24/48 228/180.5 |
| 5,701,028 A | | 12/1997 | Waki | |

(Continued)

FOREIGN PATENT DOCUMENTS

| | | |
|---|---|---|
| JP | H04243143 A | 8/1992 |
| JP | H07130918 A | 5/1995 |

OTHER PUBLICATIONS

IT Search Report and Written Opinion for IT 102016000040587 dated Jan. 6, 2017 (8 pages).

*Primary Examiner* — Reema Patel
(74) *Attorney, Agent, or Firm* — Crowe & Dunlevy

(57) ABSTRACT

A semiconductor device includes a leadframe that includes contact pins and a semiconductor die that has protruding connection formations. A flexible support member is disposed between the leadframe and the semiconductor die and supports the semiconductor die. The flexible support member has electrically conductive lines that extend between the leadframe and the semiconductor die. The electrically conductive lines of the flexible support member are electrically coupled with the contact pins of the leadframe and with the connection formations of the semiconductor die.

25 Claims, 2 Drawing Sheets

(56) References Cited

U.S. PATENT DOCUMENTS

| | | | | |
|---|---|---|---|---|
| 6,498,389 B1* | 12/2002 | Kim | ................... | H01L 23/3107 |
| | | | | 257/666 |
| 2005/0133897 A1* | 6/2005 | Baek | ................... | H01L 23/4951 |
| | | | | 257/686 |
| 2007/0023919 A1* | 2/2007 | Lin | ........................ | H01L 24/11 |
| | | | | 257/774 |

\* cited by examiner

SEMICONDUCTOR DEVICE AND CORRESPONDING METHOD

PRIORITY CLAIM

This application claims the priority benefit of Italian Application for Patent No. 102016000040587, filed on Apr. 20, 2016, the disclosure of which is hereby incorporated by reference.

TECHNICAL FIELD

The description relates to semiconductor devices. One or more embodiments may apply to metal leadframe-based packages with exposed pads.

BACKGROUND

Current leadframe-based plastic packages may include a die-attach material coupling the device to a metallic leadframe and allowing thermal end electrical power dissipation.

Die-attach integrity may be jeopardized as a result of the package being subjected to reliability stress tests, such as a Thermal Cycles Test ("TCT").

Delamination may occur as a result of thermo-mechanical stresses related to different values of the Coefficient of Thermal Expansion ("CTE") in the materials involved which may include silicon, Die Attach Material ("DAM"), copper alloy, etc.

Delamination may result in a gap being formed at the interface between two different materials in contact, such as the silicon/DAM and/or DAM/leadframe interfaces. Also, discontinuities may form within the bulk of the DAM, such as following High Temperature Storage ("HTS") testing.

These events may be detrimental to package reliability. This may particularly be the case for packages including an exposed pad due to the integrity of the thermal/electrical path being adversely affected.

Package quality and reliability requirements are becoming more and more demanding, especially in areas such as the automotive market, where the ability to provide delamination-free packages may represent a significant factor.

Various approaches have been developed in order to counter die attach delamination, primarily focusing on improvements in materials and/or the development of new materials.

For instance, attention may be paid to leadframe finishing in various ways, including but not limited to: (1) by providing for a "roughening" treatment of the leadframe surface which may enhance mechanical adhesion to the die attach material, or (2) via deposition of organic coatings on the leadframe surface to enhance chemical adhesion to the die attach material.

The use of low-stress materials has also been proposed for the die attach material.

While certain solutions have stimulated some commercial interest, none of these can be regarded as capable of solving the issue of attach delamination in a satisfactory manner.

SUMMARY

One or more embodiments provide a leadframe-based plastic package, possibly having a bottom surface of the die exposed, capable of dispensing with the use of a Die Attach Material—DAM and/or wires.

In one or more embodiments, a semiconductor device (for instance an integrated circuit such as an IC device or die) may be coupled to a flexible substrate (a "flex") by means of copper pillars or solder bumps and attached to the lead fingers of a planar metallic leadframe, thus dispensing with conventional die-pads and/or tie bars for die accommodation.

In one or more embodiments, the flex metal traces may be designed in such a way to provide electrical connections between the die and the leadframe.

In one or more embodiments, die attach delamination at the die/DAM and/or DAM/die-pad interfaces may be effectively countered.

In one or more embodiments, this may also apply to DAM degradation, with thermal/electrical dissipation degradation satisfactorily reduced.

One or more of the embodiments may offer one of more of the following advantages:

(1) Die Attach Material or DAM may be dispensed with, so that no die attach delamination at die/DAM and/or DAM/die-pad interfaces, nor DAM degradation may occur; this may result in thermal/electrical dissipation degradation being effectively countered, (2) power dissipation may be improved via an exposed die, with no thermal resistance provided by a DAM material, a die-pad and the related interfaces; this may result in improved device operative temperatures; and (3) increased flexibility may be achieved in die-leadframe routing connections, due to the possibility of replacing conventional wires with flex conductive traces. A simpler process flow may be achieved in comparison with standard process flows, (a) due to the possibility of dispensing with the presence of die pads, leadframe design complexity and costs may be reduced: this may facilitate having a single leadframe by package body size and achieving shape standardization of the inner leads, or (b) due to the possibility of dispensing with die pads and DAM, the body thickness of the package may be reduced.

BRIEF DESCRIPTION OF THE DRAWINGS

One or more embodiments will now be described, by way of example only, with reference to the annexed figures, wherein.

DETAILED DESCRIPTION

It will be appreciated that for the sake of clarity of illustration, the various figures may not be drawn to a same scale.

In the ensuing description, one or more specific details are illustrated, aimed providing an in-depth understanding of examples of embodiments. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment.

Moreover, particular conformation, structures or characteristics as exemplified in connection with any of the figures may be combined in any other quite way in one or more embodiments as possibly exemplified in other figures.

In the figures, a semiconductor die (or semiconductor device proper) is designated 10. The device 10 may be of any known type (an integrated circuit, for instance) adapted to be packaged in a leadframe-based package, such as a leadframe-based plastic package.

Figure 1:
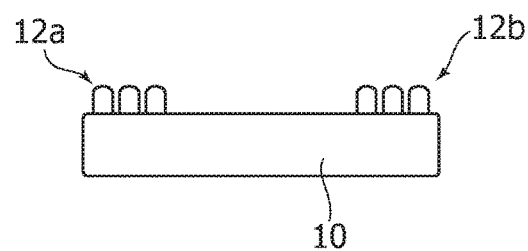
FIGS. 1 to 4 are exemplary of steps in one or more embodiments.

FIG. 1 is exemplary of the possibility of providing on such a semiconductor die 10 connection formations (electrical-mechanical) in the form of solder bumps 12*a* or metal (for example, Copper) pillars 12*b*.

The figures exemplify the possibility of providing both types of such connection formations. However, one or more embodiments may employ just one type of such connection formations, namely (only) solder bumps 12*a* or (only) metal pillars 12*b*. Also, one or more embodiments may include connection formations of other types known in the art.

Figure 2:
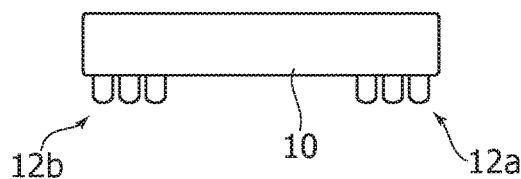

As exemplified herein, the connection formations 12*a* and/or 12*b* may be provided on contact pads of the die 12 at a surface of the die 10 facing upward. In such embodiments, the die 10 may then be turned upside down (that is "flipped" over 180°) so that the connection formations 12*a*, 12*b* face downwardly as shown in FIG. 2.

Figure 3:
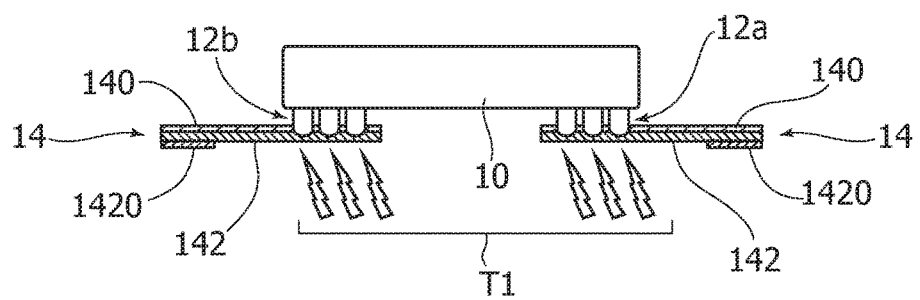

FIG. 3 is exemplary of the possible provision, in one or more embodiments, of a flexible substrate member ("flex") 14.

In one or more embodiments, such a flexible substrate may include, in a manner known per se, a flexible support layer 140, which may be of a polymer material, having provided thereon (such as, at the underside thereof, with reference to the point of view of the FIG. 3) electrically conductive lines or "tracks" (such as, metal such as copper or copper alloy) 142 defining an electrical connection layout to the connection formations 12*a*, 12*b*.

FIG. 3 is exemplary of mechanical and electrical coupling of the connection formations 12*a*, 12*b* of the die 10 and the lines or tracks 142 of the flexible support 14, with the protruding connection formations 12*a*, 12*b* of the die 10 facing towards the flexible support member 14.

This may occur, for example, by means of thermo-sonic or thermo-compression processing or other processes (schematically indicated T1) suited to produce a metal joint connection being established between the connection formations 12*a*, 12*b* of the semiconductor die 10 and the electrically conductive lines 142 of the flexible support member or flex 14.

In the exemplary embodiments of the figures, the electrically conductive lines 142 are shown provided at the surface of the flexible support layer 140 opposed to the die 10, with the connection formations 12*a*, 12*b* extending through openings (windows) provided in the flexible support layer 140 to couple with the electrically conductive lines 142 of the flexible support member 14: this representation is merely exemplary of a possible implementation and is not to be construed in a limiting sense of the extent of the embodiments.

Figure 4:
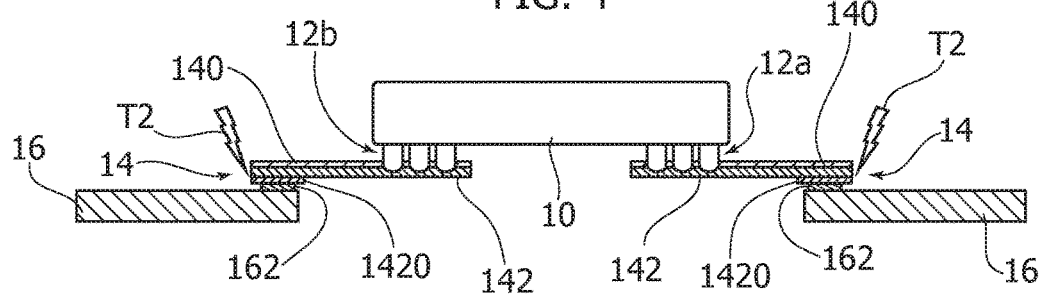

In one or more embodiments as exemplified in FIG. 4, the flexible support member or flex 14 may be coupled to a metallic leadframe 16.

In one or more embodiments the leadframe 16 may include contact pins (lead fingers or tips) and be generally annular, thus having a central area for mounting the semiconductor die 10.

In one or more embodiments, coupling of the flexible support member 14, such as the electrically conductive lines 142, with the metallization of contact pins of the metallic leadframe 16 (indicated 162) may be at metallized portions of the conductive lines 142 (indicated 1420).

In one or more embodiments, coupling the flexible support member 14 (the electrically conductive lines 142) with the lead tips of the metallic leadframe 16 may be by means of a further process (T2 in FIG. 4) known for that purpose, such as providing a metal joint connection between the metallized portions of the conductive lines 142 (indicated 1420) plated onto the flexible support layer 140 and the finishing of the lead tips of the leadframe (indicated 162).

Processing schematically indicated as T2 may include thermo-sonic or diffusion soldering processes.

In one or more embodiments, processing T2 in FIG. 4 may be the same as processing T1 exemplified in FIG. 3.

In one or more embodiments processing may be different from the processing T1 exemplified in FIG. 3.

It will be appreciated that the orientation of the various parts/elements represented in FIGS. 1 to 4 is purely exemplary.

Merely by way of example, the connecting formations 12*a*, 12*b* may be provided: (1) with the contact pads of the die 10 facing upward as shown herein, with the die 10 subsequently turned upside down (tipped 180°) or, alternatively, (2) with the die 10 already oriented with its contact pads pointing downward as exemplified in FIG. 2.

Similarly, coupling of the die 10 with the flexible support 14 and the leadframe 16 may take place with the die 10 located above the flexible member 14 and the leadframe 16 or, alternatively, with the die 10 arranged under the flexible member 14 and/or the leadframe 16.

The orientation of the various parts/elements shown in FIGS. 1 to 4 is thus purely exemplary and not limitative of the extent of the embodiments.

Figure 5:
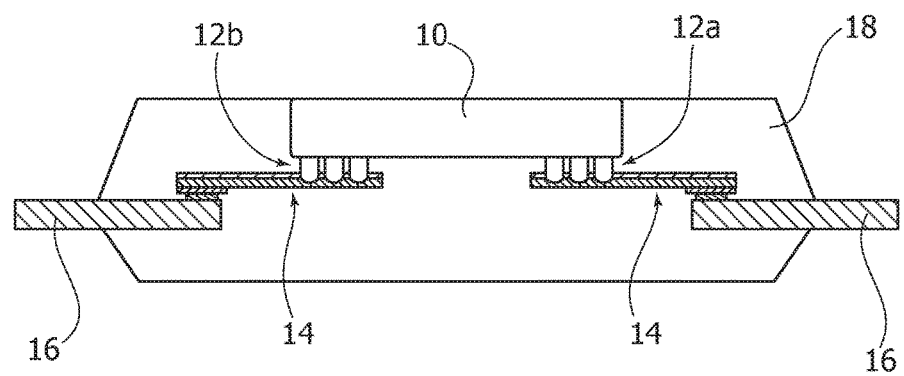
FIGS. 5 to 7 are exemplary of various semiconductor device packages adapted to include embodiments.
Figure 6:
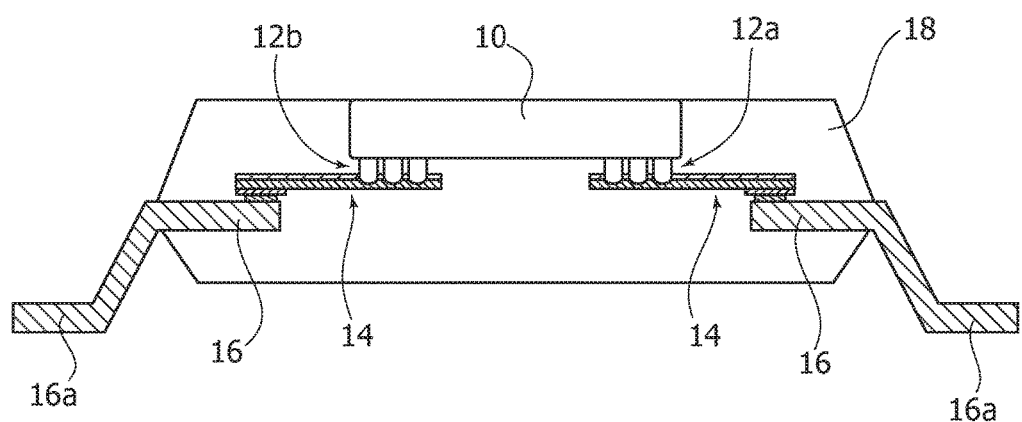
Figure 7:
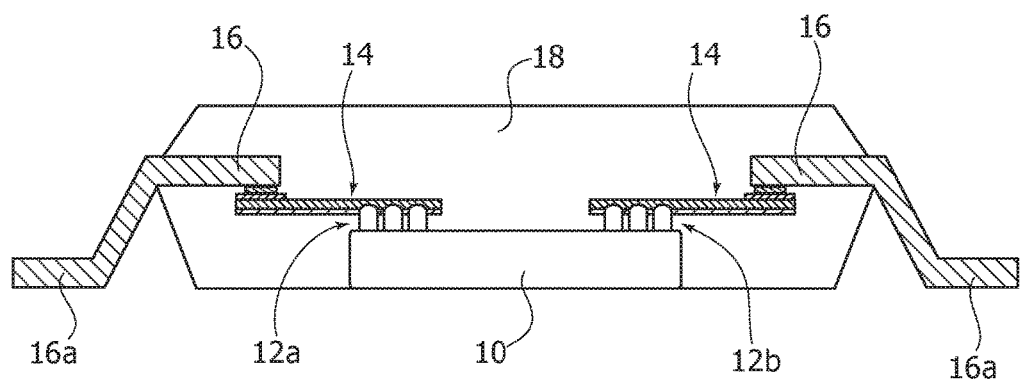

The foregoing also applies to FIGS. 5 to 7.

These figures are representative of various ways of coupling the assembly of parts/elements shown in FIG. 4 with a package 18.

In one or more embodiments, the package 18 may include a so-called "plastic" package including a Package Molding Compound (PMC) of any known type molded onto the assembly of parts/elements of FIG. 4.

One or more embodiments may adopt a standard transfer mold process so that the die 10 is not exposed at the outer surface of the package 18.

FIG. 5 is exemplary of one or more embodiments resorting to a film-assisted molding process in order to expose the silicon (back side) surface of the die 10.

FIG. 6 is exemplary of a standard cropping and singulation step in the case of an exposed die "up" configuration, with the die 10 exposed at the top surface of the package 18 in order to permit coupling with a heat sink (not visible in the figures) with the pins of the leadframe 16 possibly bent "downward" (shown at 16*a*). This may facilitate electrical coupling with electrically conductive lines provided on an underlying mounting board (such as a printed circuit board or PCB—not shown in the figures).

FIG. 7 is exemplary of a standard cropping and singulation step in the case of an exposed die "down" configuration, namely with the die 10 exposed at the bottom surface of the package 18 (possibly after a 180° "flip", that is overturning the assembly exemplified in FIG. 4) with the pins of the leadframe 16 possibly again bent "downward" (shown at 16*a*) in order to facilitate electrical connection (such as via soldering to the PCB electrically conductive tracks) possibly with a Back Side Metallization ("BSM") to allow die surface soldering onto the PCB.

One or more embodiments may thus facilitate solving die-attach delamination issues, such as by dispensing with die-attach materials.

In that respect, one or more embodiments may thus provide a semiconductor device, including: (1) a leadframe (e.g. 16) including contact pins and having a central area, (2) a semiconductor die (e.g. 10) arranged at said central area of the leadframe, the semiconductor die having protruding connection formations (e.g. 12*a*, 12*b*), and (3) a flexible support member (e.g. 14) set between the leadframe and the semiconductor die at said central area, the flexible support member with electrically conductive lines (e.g. 142) extending between the leadframe and the semiconductor die, wherein said electrically conductive lines of the flexible support member are electrically coupled with contact pins of the leadframe and with the connection formations of the semiconductor die.

In one or more embodiments, the connection formations of the semiconductor die may include solder bumps and/or metal pillars, optionally copper pillars.

One or embodiments may include metal joint connections between: (1) the electrically conductive lines of the flexible support member and the contact pins of the leadframe, and/or, (2) the electrically conductive lines of the flexible support member and the connection formations of the semiconductor die.

In one or more embodiments, the flexible support member may include a flexible support layer (shown at 140) having said electrically conductive lines extending thereon.

In one or more embodiments, the connection formations of the semiconductor die may extend through said flexible support layer of the flexible support member.

One or more embodiments may include a package (shown at 18) molded onto said leadframe, said semiconductor die and said flexible support member set there between.

In one or more embodiments, the semiconductor die may be exposed at the surface of said package.

One or more embodiments may provide a method of producing a semiconductor device, including: (1) providing a leadframe including contact pins and having a central area, (2) arranging a semiconductor die at said central area of the leadframe, the semiconductor die having protruding connection formations, and (3) setting a flexible support member between the leadframe and the semiconductor die at said central area, the flexible support member with electrically conductive lines extending between the leadframe and the semiconductor die, and electrically coupling the electrically conductive lines of the flexible support member with the contact pins of the leadframe, and the connecting formations of the semiconductor die.

One or more embodiments may include: (1) coupling the electrically conductive lines of the flexible support member with the connecting formations of the semiconductor die via one of thermo-sonic coupling or thermo-compression coupling, and/or (2) coupling the electrically conductive lines of the flexible support member with the contact pins of the leadframe via one of thermo-sonic coupling and diffusion soldering.

Without prejudice to the underlying principles, the details and embodiments may vary, even significantly, with respect to what has been disclosed by way of example only, without departing from the extent of protection.

What is claimed is:

1. A semiconductor device, including:
    a leadframe including contact pins and defining a central area;
    a semiconductor die positioned at said central area, the semiconductor die having protruding connection formations;
    a flexible support member having a first surface supporting the semiconductor die and a second surface disposed opposite the first surface, the second surface physically contacting the contact pins of the leadframe, the flexible support member being disposed between the leadframe and the semiconductor die and having electrically conductive lines extending between the leadframe and the semiconductor die; and
    wherein said electrically conductive lines of the flexible support member are electrically coupled with the contact pins of the leadframe and with the connection formations of the semiconductor die.

2. The semiconductor device of claim 1, wherein the connection formations of the semiconductor die include solder bumps.

3. The semiconductor device of claim 1, wherein the connection formations of the semiconductor die include metal pillars.

4. The semiconductor device of claim 1, wherein the connection formations of the semiconductor die include copper pillars.

5. The semiconductor device of claim 1, further comprising metal joint connections between the electrically conductive lines of the flexible support member and the contact pins of the leadframe.

6. The semiconductor device of claim 1, further comprising metal joint connections between the electrically conductive lines of the flexible support member and the connection formations of the semiconductor die.

7. The semiconductor device of claim 1, further comprising metal joint connections between the electrically conductive lines of the flexible support member and the contact pins of the leadframe and between the electrically conductive lines of the flexible support member and the connection formations of the semiconductor die.

8. The semiconductor device of claim 1, wherein the flexible support member includes a flexible support layer having said electrically conductive lines extending thereon.

9. The semiconductor device of claim 8, wherein the connection formations of the semiconductor die extend through said flexible support layer of the flexible support member.

10. The semiconductor device of claim 8, further comprising a package molded onto said leadframe, said semiconductor die, and said flexible support member.

11. The semiconductor device of claim 10, wherein the semiconductor die is exposed at a surface of said package.

12. The semiconductor device of claim 1, wherein the flexible support member includes a flexible support layer made of a polymer material and wherein the leadframe is made of a metal material.

13. A semiconductor device, comprising:
    a flexible polymer support member supporting a semiconductor die having connection formations extending from a first surface of the semiconductor die facing in a first direction;
    electrically conductive lines disposed on the flexible polymer support member and electrically connected to the connection formations;

a metal leadframe having an annular shape and defining contact pins;

wherein said electrically conductive lines on the flexible support member are electrically coupled with the contact pins of the leadframe; and wherein the flexible polymer support member is disposed between the semiconductor die and the leadframe in the first direction.

14. The semiconductor device of claim 13, wherein the metal leadframe defines an inner perimeter portion surrounding a central area, the electrically conductive lines being attached to the inner perimeter portion of the leadframe.

15. The semiconductor device of claim 13, further comprising a package molded onto said leadframe, said semiconductor die, and said flexible support member, a surface of the semiconductor die being exposed from the package.

16. The semiconductor device of claim 15, wherein the exposed surface of the semiconductor die is coplanar with an upper surface of the package.

17. The semiconductor device of claim 13, wherein the flexible support member includes a flexible support layer, the connection formations of the semiconductor die extending through the flexible support layer to contact the electrically conductive lines.

18. The semiconductor device of claim 13, comprising a package molded onto said leadframe, said semiconductor die, and said flexible support member, a surface of the semiconductor die being exposed from the package, the contact pins of the leadframe being angled downward to extend away from the exposed surface of the semiconductor die.

19. The semiconductor device of claim 13, comprising a package molded onto said leadframe, said semiconductor die, and said flexible support member, a surface of the semiconductor die being exposed from the package, the contact pins of the leadframe being angled downward to extend toward the exposed surface of the semiconductor die.

20. A method of producing a semiconductor device, including:

providing a leadframe including contact pins and surrounding a central area;

arranging a semiconductor die to be aligned with said central area, the semiconductor die having protruding connection formations extending in a first direction from a first surface;

providing a flexible support member between the leadframe and the semiconductor die in the first direction, the flexible support member having electrically conductive lines extending between the leadframe and the semiconductor die; and electrically coupling the electrically conductive lines of the flexible support member with the contact pins of the leadframe and the connecting formations of the semiconductor die.

21. The method of claim 20, wherein electrically coupling the electrically conductive lines of the flexible support member with the connecting formations of the semiconductor die comprises one of the group of thermo-sonic coupling and thermo-compression coupling.

22. The method of claim 20, wherein electrically coupling the electrically conductive lines of the flexible support member with the contact pins of the leadframe comprises one of the group of thermo-sonic coupling and diffusion soldering.

23. The method of claim 20, wherein:

electrically coupling the electrically conductive lines of the flexible support member with the connection formations of the semiconductor die comprises one of the group of thermo-sonic coupling and thermo-compression coupling; and electrically coupling the electrically conductive lines of the flexible support member with the contact pins of the leadframe comprises one of the group of thermo-sonic coupling and diffusion soldering.

24. A semiconductor device, including:

a leadframe including contact pins and defining a central area;

a semiconductor die positioned at said central area, the semiconductor die having protruding connection formations;

a flexible support member comprising a polymeric layer and electrically conductive lines plated on the polymeric layer, the electrically conductive lines having a first surface in contact with the polymeric layer and a second surface disposed opposite the first surface; and wherein the protruding connection formations physically contact the first surface of the electrically conductive lines and the contact pins of the leadframe physically contact the second surface of the electrically conductive lines, the electrically conductive lines being electrically coupled with the contact pins and the protruding connection formations.

25. The semiconductor device of claim 24 wherein the protruding connection formations of the semiconductor die extend through said polymeric layer.

* * * * *